United States Patent
Ueki et al.

(10) Patent No.: US 8,080,878 B2
(45) Date of Patent: Dec. 20, 2011

(54) SEMICONDUCTOR DEVICE HAVING INSULATING FILM WITH SURFACE MODIFICATION LAYER AND METHOD FOR MANUFACTURING THE SAME

(75) Inventors: Makoto Ueki, Kanagawa (JP); Takahiro Onodera, Kanagawa (JP); Yoshihiro Hayashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 137 days.

(21) Appl. No.: 12/557,677

(22) Filed: Sep. 11, 2009

(65) Prior Publication Data

US 2010/0059887 A1    Mar. 11, 2010

(30) Foreign Application Priority Data

Sep. 11, 2008 (JP) ................... 2008-233764

(51) Int. Cl.
*H01L 23/48* (2006.01)
*H01L 23/52* (2006.01)

(52) U.S. Cl. ........ 257/759; 257/758; 257/760; 257/762; 257/E23.145

(58) Field of Classification Search ................ 257/759, 257/760, 758, 762, E23.145
See application file for complete search history.

(56) References Cited

U.S. PATENT DOCUMENTS

| | | | | |
|---|---|---|---|---|
| 7,180,191 | B2* | 2/2007 | Sasaki et al. | 257/758 |
| 7,427,563 | B2* | 9/2008 | Lu et al. | 438/643 |
| 7,763,979 | B2* | 7/2010 | Ohto et al. | 257/759 |
| 2003/0042613 | A1* | 3/2003 | Shioya et al. | 257/762 |
| 2005/0161821 | A1* | 7/2005 | Lee et al. | 257/758 |

FOREIGN PATENT DOCUMENTS

| | | |
|---|---|---|
| JP | 2004-253790 | 9/2004 |
| JP | 2007-027347 | 2/2007 |

* cited by examiner

*Primary Examiner* — Nitin Parekh
(74) *Attorney, Agent, or Firm* — Young & Thompson

(57) ABSTRACT

Provided is a semiconductor device, which includes an interlayer insulating film formed on a semiconductor substrate, a wiring layer filled in a recess formed in the interlayer insulating film, and a cap insulating film. The interlayer insulating film includes a first SiOCH film and a surface modification layer including an SiOCH film formed by modifying a surface layer of the first SiOCH film, the SiOCH film having a lower carbon concentration and a higher oxygen concentration than the first SiOCH film has. The cap insulating film contacts with surfaces of the metal wiring and the surface modification layer.

14 Claims, 11 Drawing Sheets

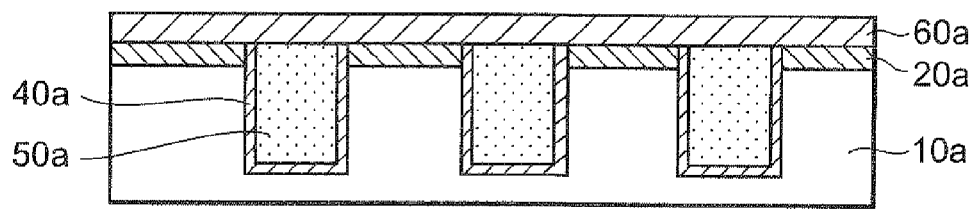
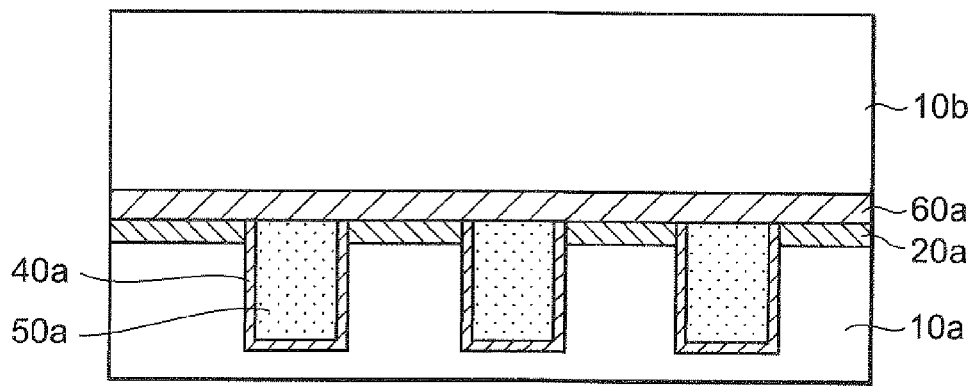
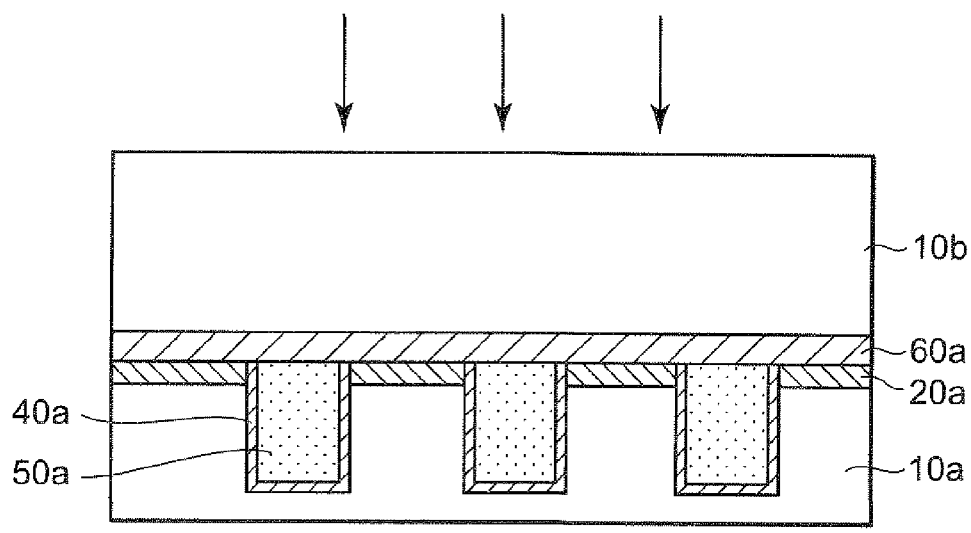

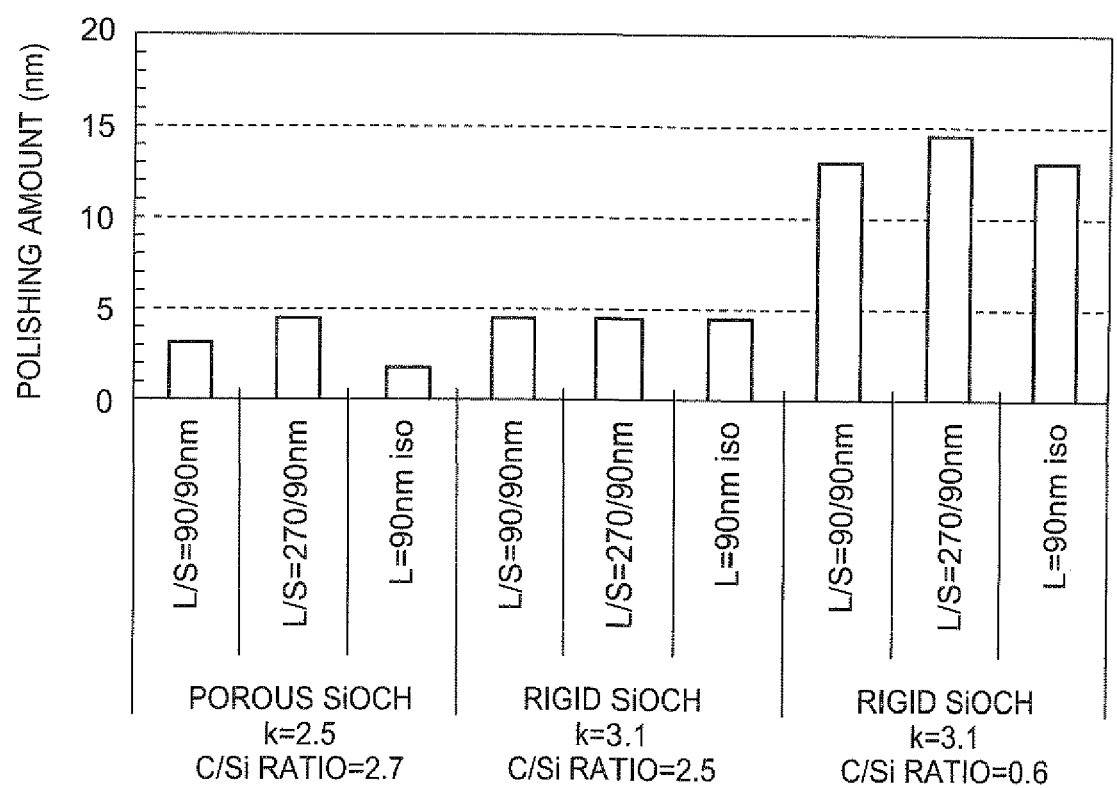

SEMICONDUCTOR DEVICE HAVING INSULATING FILM WITH SURFACE MODIFICATION LAYER AND METHOD FOR MANUFACTURING THE SAME

BACKGROUND OF THE INVENTION

1. Field of the Invention

The present invention relates to a semiconductor device and a manufacturing method for the semiconductor device.

2. Description of the Related Art

Conventionally, aluminum (Al) or an aluminum alloy is widely used as a material for wirings of a semiconductor device, while a silicon oxide ($SiO_2$) film is widely used as a material for an interlayer insulating film of the semiconductor device. However, along with a progress in a finer pattern and higher speed of semiconductor devices, for improving a signal transmission delay in wirings, copper (Cu) having a lower resistance has become to be used as the material for wirings, whereas low dielectric constant film having lower dielectric constant such as an SiOCH film has become to be used as the insulating film.

In a case of forming Cu wirings, a dry etching process is difficult, and hence a damascene method is used in most cases. The damascene method includes steps of forming a groove in the insulating film formed on the semiconductor substrate, filling Cu in the groove, and polishing off excess Cu other than the wiring, thereby forming the Cu wiring.

Hereinafter, a common manufacturing method for the Cu wirings is described with reference to FIGS. 10 and 11.

FIG. 10A illustrates lower layer wirings on which upper layer wirings are to be formed. The lower layer wiring has a structure in which a cap insulating film 60a is formed on an SiOCH filth 10a as the insulating film, and a Cu wiring 50a is filled in a wiring groove or a wiring hole having a barrier film 40a formed on the inner wall thereof. The lower layer wiring can be formed by the same process as the upper layer wiring that is described below.

First, as illustrated in FIG. 10B, an SiOCH film 10b is formed on the lower layer wiring. Next, as illustrated in FIG. 10C, using lithography and anisotropic etching, a wiring groove or a wiring hole is formed in the SiOCH film 10b. Next, as illustrated in FIG. 11A, a barrier film 40b that is a conductor film is formed in the wiring groove or the wiring hole, and further a Cu wiring 50b is filled in the wiring groove or the wiring hole. Next, using chemical mechanical polishing (CMP), excess Cu 50b and excess barrier film 40b outside the wiring groove or the wiring hole are removed (FIG. 11B). A cap insulating film 60b as an insulator is formed on the same, whereby a Cu wiring structure can be formed, which has the lower surface and the side surfaces covered with the barrier film 40b and the upper surface covered with the cap insulating film 60b as illustrated in FIG. 11C.

The SiOCH film 10 (10a and 10b) that is used as an insulating film between wires is a porous low dielectric constant film having a relative dielectric constant that is decreased to be 2.6 or lower by forming pores in the film for reducing parasitic capacitance between wires. However, the low dielectric constant film has characteristics of low mechanical strength and a hydrophobic surface. Therefore, if the low dielectric constant film is exposed in the CMP process for forming the Cu wirings by the damascene method, there may be a problem of film peeling or generation of particles or a watermark due to detergent deterioration.

In view of this problem, in order that the low dielectric constant film be protected, it is possible to form a hard mask made of an $SiO_2$ or rigid low dielectric constant film having a relative dielectric constant without pores of approximately 3.0 on the low dielectric constant film.

Japanese Patent Application Laid-Open No, 2004-253790 (hereinafter, referred to as Patent Document 1) and Japanese Patent Application Laid-Open No. 2007-27347 (hereinafter, referred to as Patent Document 2) describe a semiconductor device in which the hard mask is formed on the low dielectric constant film as the interlayer insulating film of the Cu wiring structure.

Patent Document 1 describes a semiconductor device in which copper wirings are formed in an interlayer insulating film that is a lamination of a first SiOCH film, a second SiOCH film having C and H concentrations lower than those of the first SiOCH film and an O concentration higher than that of the first SiOCH film, and an $SiO_2$ film, and further an SiCNH film is formed as an insulating film for preventing metal diffusion on the $SiO_2$ film.

Patent Document 2 describes a semiconductor device in which wirings are formed in the interlayer insulating film including a porous low dielectric constant film and a hard mask, and, e.g., a silicon carbide (SiC) film is further formed as an antioxidant film layer on the hard mask layer. This hard mask is made of a silicon oxide ($SiO_2$).

However, according to the semiconductor device described in Patent Document 1, a silicon oxide ($SiO_2$) film having a high dielectric constant is formed on the first SiOCH film and the second SiOCH film that are used as the low dielectric constant film. In addition, according to the semiconductor device described in Patent Document 2, the hard mask made of a silicon oxide ($SiO_2$) having a high dielectric constant is formed on the porous low dielectric constant film. Therefore, in each of the semiconductor devices described in Patent Documents 1 and 2, if there is a structure for protecting the interlayer insulating film having a low dielectric constant by the hard mask or the like, the dielectric constant of the interlayer insulating film is increased.

SUMMARY OF THE INVENTION

A semiconductor device according to the present invention includes:
a semiconductor substrate;
a first insulating film including an SiOCH film formed on the semiconductor substrate;
a surface modification layer formed by modifying a surface layer of the first insulating film, the surface modification layer having a lower carbon concentration and a higher oxygen concentration than the first insulating film has;
a metal wiring filled in a recess formed in the surface modification layer and the first insulating film; and
a second insulating film contacting surfaces of the metal wiring and the surface modification layer.

The semiconductor device includes the surface modification layer formed by modifying the surface layer of the first insulating film made of the SiOCH film, the surface modification layer having the lower carbon concentration and the higher oxygen concentration than the first insulating film has, and also includes the second insulating film contacting the surfaces of the metal wiring and the surface modification layer.

The surface modification layer is formed by modifying the surface layer of the SiOCH film, and thus is thinner than the case of depositing the film. Therefore, even if a dielectric constant of the surface modification layer is higher than a dielectric constant of the SiOCH film, it is possible to suppress an increase in the dielectric constant of the entire SiOCH film because the surface modification layer is sufficiently thin.

Moreover, the surface modification layer has the lower carbon concentration and the higher oxygen concentration than the first insulating film has, and thus has an affinity for water. Therefore, sweat hardly remains on the surface modification layer that is exposed in the CMP process, and hence residual particles and generation of a watermark after the CMP process can be reduced.

A manufacturing method for a semiconductor device according to the present invention includes:

forming a first insulating film including an SiOCH film on a semiconductor substrate;

forming a surface modification layer as a surface layer of the first insulating film by performing plasma treatment using an inert gas;

forming a hard mask on the surface modification layer;

forming a recess in the hard mask and the first insulating film, the recess passing through the hard mask and the surface modification layer;

forming a metal wiring to fill in the recess;

exposing the surface modification layer by removing a part of the metal wiring exposed outside the recess and by removing the hard mask; and forming a second insulating film on surfaces of the exposed surface modification layer and the metal wiring.

The manufacturing method for the semiconductor device includes the forming the surface modification layer as the surface layer of the first insulating film by performing the plasma treatment on the first insulating film made of the SiOCH film using the inert gas, the exposing the surface modification layer by removing the part of the metal wiring exposed outside the recess and by removing the hard mask, and the forming the second insulating film on the surfaces of the exposed surface modification layer and the metal wiring.

According to the manufacturing method for the semiconductor device, the surface modification layer is formed by the plasma treatment using the inert gas performed on the surface layer of the SiOCH film, and therefore is thinner than the case of depositing the film. Therefore, even if a dielectric constant of the surface modification layer is higher than a dielectric constant of the SiOCH film, it is possible to suppress an increase in the dielectric constant of the entire SiOCH film because the surface modification layer is sufficiently thin.

Moreover, the surface modification layer has the lower carbon concentration and the higher oxygen concentration than the first insulating film has, and thus has an affinity for water. Therefore, sweat hardly remains on the surface modification layer that is exposed in the CMP process, and hence residual particles and generation of a watermark of ter the CMP process can be reduced.

According to the present invention, it is possible to realize the semiconductor device having the structure in which the interlayer insulating film made of a low dielectric constant film can be protected from damage in the CMP process, and an effective dielectric constant of the interlayer insulating film is reduced, and the manufacturing method for the semiconductor device.

BRIEF DESCRIPTION OF THE DRAWINGS

In the accompanying drawings:

FIGS. 2A to 2C are cross sections illustrating manufacturing steps for the semiconductor device according to the embodiment of the present invention;

FIG. 9 is a graph illustrating a relationship between the SiOCH film and a polishing amount;

DETAILED DESCRIPTION OF THE PREFERRED EMBODIMENTS

Figure 1:
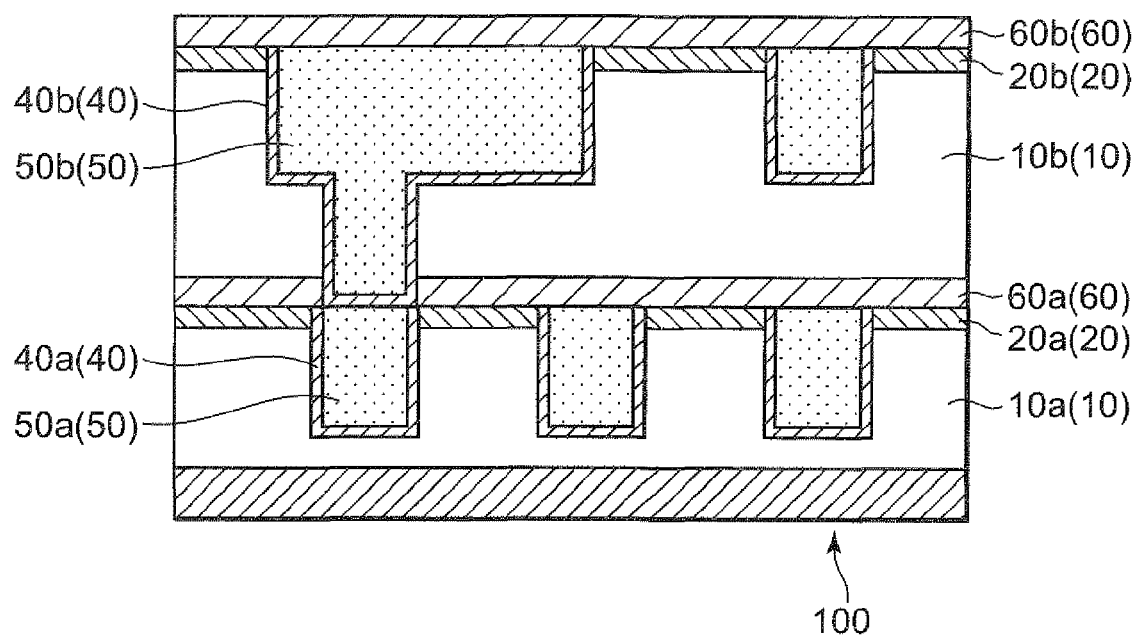
FIG. 1 is a cross section illustrating a structure of a semiconductor device according to an embodiment of the present invention.

Now, a preferred embodiment of the semiconductor device according to the present invention is described in detail with reference to the attached drawings. Note that the same element is denoted by the same reference symbol in descriptions of the drawings and overlapping description is omitted.

In addition, meanings of terms used in the description of this embodiment are as follows.

A damascene wiring means an embedded wiring that is formed by filling a metal wiring material in a groove formed in advance in an interlayer insulating film and by removing excess metal other than that in the groove by a CMP process or the like. If Cu is used for forming the damascene wiring, side surfaces and a periphery of the Cu wirings are covered with a barrier metal while the upper surface of the Cu wirings is covered with an insulating barrier film as a common wiring structure.

A chemical mechanical polishing (CMP) method means a method of flattening the wafer surface having unevenness generated in a multilayer wiring formation process by making the wafer surface contact with a polishing pad that is rotating so that the wafer surface is polished while polishing liquid is being supplied to the wafer surface. When wirings are formed by the damascene method, the CMP method is used in particular for removing excess metal portions after the metal is filled in the wiring groove or a via hole, to thereby obtain a smooth wiring surface.

A plasma CVD method means, for example, a method of forming a continuous film on the substrate by continuously supplying a gaseous material to a reaction chamber under a reduced pressure, and by using electric energy for making molecules to be in an excited state, so as to induce a gas phase reaction or a substrate surface reaction.

A PVD method may be an ordinary sputtering method or a sputtering method having high directivity such as a long throw sputtering method, a collimated sputtering method or an ionized sputtering method for improving the embedded characteristic, film quality, and uniformity of film thickness within the wafer surface. If an alloy is sputtered, a metal other than the main component is caused to be contained in a metal target at a ratio of the solubility limit or lower in advance, whereby the formed metal film becomes an alloy film. The PVD method can be mainly used for forming a Cu seed layer or a Cu alloy seed layer, and a barrier metal layer when damascene Cu wirings are formed.

An insulating film means, for example, a film for insulating and separating the wiring material (interlayer insulating film). In addition, a low dielectric constant insulating film means a film having a relative dielectric constant lower than that of the silicon oxide film (having a relative dielectric constant of 3.9 to 4.5).

An effective dielectric constant means an average value of the dielectric constant of the interlayer insulating films in the structure including a plurality of layers having different relative dielectric constants, which include the insulating film between wires or between layers, the barrier film, and the like.

First Embodiment

FIG. 1 is a cross section illustrating a semiconductor device according to a first embodiment of the present invention.

A semiconductor device 100 includes:

a semiconductor substrate;

an SiOCH film 10 (first insulating film) formed on the semiconductor substrate;

a surface modification layer 20 including an SiOCH film formed by modifying a surface layer of the SiOCH film 10, the SiOCH film having a lower carbon concentration and a higher oxygen concentration than the SiOCH film 10 has;

a Cu wiring 50 filled in a recess formed in the surface modification layer 20 and the SiOCH film 10; and a cap insulating film (second insulating film) 60 contacting surfaces of the Cu wiring 50 and the surface modification layer 20.

The SiOCH film 10 (10a and 10b) is formed on the semiconductor substrate. The SiOCH film 10 works as a film for reducing capacitance between multilayer wires for connecting semiconductor elements.

The SiOCH film 10 is a low dielectric constant insulating film having a relative dielectric constant lower than that of the silicon oxide film (having a relative dielectric constant within a range from 3.9 to 4.5), and is a porous insulating film. Some examples of the SiOCH film 10 are a film obtained by making a silicon oxide film to have a porous structure so that the relative dielectric constant thereof is decreased, a hydrogen silsesquioxane (HSQ) film, and a film obtained by making SiOCH or SiOC (e.g., Black Diamond™, CORAL™, and Aurora™) to have a porous structure so that the relative dielectric constant thereof is decreased.

It is preferable that the SiOCH film 10 should have a composition ratio expressed by C/Si within a range from 1 to 10. In other words, it is preferable that the SiOCH film 10 should have a large carbon amount (C amount). It is because of the following two reasons.

A first reason is that thickness of the surface modification layer 20 formed by the He plasma treatment can be decreased, whereby an increase in the effective dielectric constant can be suppressed. In the He plasma treatment performed on the surface of the SiOCH film 10, a methyl radical of SiCH$_3$ bond on the surface is separated so as to change into the SiOH bond. Therefore, the relative dielectric constant of the surface modification layer 20 is increased. Thus, a hydrocarbon (CHx) bond of a high order is lead into the film, and the composition ratio expressed by C/Si is set to be one or larger, whereby energy of the He plasma is used mainly for cutting off the C—C bond while the Si—CH$_3$ bond is not cutoff and is maintained. As a result, thickness of the surface modification layer 20 can be decreased.

Further, a second reason is that because a CMP selection ratio with respect to SiO$_2$ that is used as a hard mask 30 described later becomes large, a sufficient CMP process margin can be secured. In other words, if a large amount of carbon is contained in the SiOCH film 10, even if the C amount is decreased in the modification process by the He plasma, a certain extent of the C amount is maintained in the surface modification layer 20. Therefore, if the CMP process is performed under the condition that the SiO$_2$ layer used as the hard mask 30 is polished, a CMP polishing rate is decreased as the C amount is increased. Therefore, it is possible to suppress a variation in the film thickness with respect to overpolishing. In addition, the surface modification layer 20 can reduce exposure of the SiOCH film 10 due to the overpolishing, whereby generations of a watermark and particles can be reduced.

The SiOCH film 10 may be a porous film having a plurality of pores. Thus, the dielectric constant can be further decreased. In addition, the pores may be separated from each other. Thus, the maximum diameter of the pores can be decreased while the pore ratio of the entire SiOCH film 10 can be increased.

In addition, there is no particular lower limit value of the average diameter of the pores, and it is preferable that the average diameter be smaller than 0.8 nm. Thus, the surface modification layer 20 that is formed by the He plasma treatment is limited to the surface layer of the SiOCH film 20, i.e., to the vicinity of the surface thereof. Therefore, it is possible to minimize the increase of the effective dielectric constant due to the increase of the dielectric constant of the surface modification layer 20. In addition, the pore diameter is smaller than 0.8 nm, and hence it is possible to suppress the absorption of water when the surface modification layer 20 is exposed in the CMP process.

The SiOCH film 10 may be formed by a plasma polymerization method using a compound having a cyclic organic silica structure expressed by the following Formula (1) as the material. Thus, the SiOCH film 10 having a small pore diameter can be obtained. In addition, the pore diameter of the SiOCH film 10 is small, and hence little absorption of water occurs. As a result, it is possible to suppress an increase of the dielectric constant due to the absorption of water when the film is exposed in the CMP process.

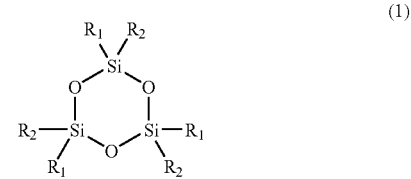

(1)

In Formula (1), R1 and R2 are one of vinyl radical, allyl radical, methyl radical, ethyl radical, propyl radical, isopropyl radical, and butyl radical.

In the compound having the cyclic organic silica structure mentioned above, R1 may be unsaturated hydrocarbon radical and R2 may be saturated hydrocarbon radical. In this case, a low dielectric constant insulating film, which is combined with a cyclic silica, can be grown by a plasma polymerization of the unsaturated hydrocarbon radical R1. Specifically, the compound having the cyclic organic silica structure may be a compound having a cyclic organic silica structure expressed by the following Formula (2), where R1 is vinyl radical and R2 is methyl radical. R1 may be allyl radical, butynyl radical, and ethynyl radical and that R2 may be ethyl radical, propyl radical, and butyl radical.

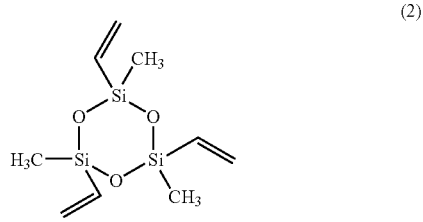

(2)

The compound having the cyclic organic silica structure mentioned above may be a compound having a cyclic organic silica structure expressed by the following Formula (3), where R1 may be vinyl radical and R2 may be saturated hydrocarbon with a greatly sterically-hindered branch structure, such as isopropyl radical.

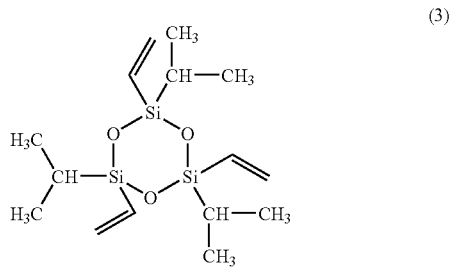

(3)

It is preferable that a side chain R2 has a greatly sterically-hindered structure, because a density of the insulating film can be reduded and then a relative dielectric constant of the insulating film can be lowered. As saturated hydrocarbon with a greatly sterically-hindered branch structure, for example, isobutyl radical and butyl radical etc., may be used.

In addition, when the film is formed by the plasma CVD method using the compound having the cyclic organic silica structure expressed by Formula (2) and (3) as the material, the film having a small dense pore structure is formed, in which the average pore diameter is 0.3 to 0.7 nm, for example.

The surface modification layer 20 (20a and 20b) is formed by modifying the vicinity of the surface layer of the SiOCH film 10, and has a lower carbon concentration and a higher oxygen concentration than the SiOCH film 10 has. Such the surface modification layer 20 has an affinity for water.

The surface modification layer 20 is formed by performing the He plasma treatment on the surface of the SiOCH film 10.

Specifically, before forming the hard mask 30 on the SiOCH film 10, the He plasma treatment is performed in a chamber for forming the hard mask. If the He plasma treatment is performed appropriately, the surface modification layer 20 that has obtained hydrophilic property remains even after the hard mask 30 is removed in the CMP process, and hence generation of the particles and the watermark after the CMP process can be suppressed.

In contrast, if the He plasma treatment is performed excessively, the surface modification layer 20 becomes thick, resulting in the problem of exfoliation of the hardened surface modification layer 20 in the CMP process, which causes a large scale of scratch. Therefore, the condition for the He plasma treatment is adjusted appropriately so that the surface modification layer 20 is formed as the surface layer of the SiOCH film 10.

In addition, the He plasma treatment decreases the carbon concentration in the surface modification layer 20, but carbon having a certain extent of concentration remains in the surface modification layer 20 as well if the carbon concentration is high in the SiOCH film 10. In this case, the CMP selection ratio is secured with respect to the hard mask 30 made of $SiO_2$. In other words, the surface modification layer 20 is hardly polished by the overpolishing after the hard mask 30 is removed by the CMP process. Moreover, even if the surface modification layer 20 is thin, it is possible to stop the CMP process in the state where the surface modification layer 20 is left with a sufficient margin.

It is preferable that the thickness of the surface modification layer 20 should be a value equal to or larger than 3 nm and smaller than 30 nm. The thickness of the surface modification layer 20 means the thickness of the surface layer of the SiOCH film 10 in the region in which the carbon concentration is equal to or larger than 50% and smaller than 90% of the carbon concentration in the SiOCH film 10 while the oxygen concentration is equal to or larger than 110% and smaller than 200% of the oxygen concentration of the SiOCH film 10, for example.

The Cu wirings 50 (50a and 50b) are formed in the SiOCH film 10. As illustrated in FIG. 1, the Cu wiring 50 is covered with the barrier film 40 that is formed on the inner wall of the recess (wiring groove or wiring hole), and the upper surface thereof is covered with a film having an insulating property such as a barrier insulating film or the cap insulating film 60. The Cu wirings 50 are formed by filling the Cu wirings 50 in the recesses formed in the SiOCH film 10 and the surface modification layer 20, and removing the excess Cu wirings 50 exposed outside the recesses by the CMP process or the like, for example.

The Cu wirings 50 is a metal wiring made of Cu mainly. In order to improve reliability of the Cu wirings 50, a metal element other than Cu may be contained in the member made of Cu. In addition, a metal element other than Cu may be formed on the upper surface or the side surface of Cu.

The barrier film 40 (40a and 40b) is formed on the inner wall of the recess in which the Cu wiring 50 is formed. The barrier film 40 has a function of preventing metal elements constituting the Cu wiring 50 from diffusing into the interlayer insulating film or the lower layer.

In addition, the barrier film 40 is a conductive film having a barrier property, for example. If the wiring is made of metal elements containing Cu mainly, a high melting point metal or a nitride thereof is used, which includes tantalum (Ta), tantalum nitride (TaN), titanium nitride (TiN), and tungsten carbide nitride (WCN). In addition, it may be a lamination film using those materials.

The cap insulating film 60 (60a and 60b) is formed so as to contact with the upper surfaces of the Cu wirings 50 and the surface modification layer 20. The cap insulating film 60 has a function of preventing oxidation of Cu contained in the Cu wirings 50 and diffusion of Cu into the insulating film, and it has a role as an etching stop layer in the process. If the dielectric constant of the cap insulating film 60 is decreased, it is possible to improve a signal transmission delay through the wiring. The cap insulating film 60 also works as the barrier insulating film.

As the cap insulating film 60, there are an SiN film, an SiCN film, an SiC film, an organic silica film having Cu diffusion barrier property, and the like.

In addition, the cap insulating film 60 may be a lamination film using one or more layers of the organic silica film having Cu diffusion barrier property, the SiN film, the SiCN film, and the SiC film. In addition, the cap insulating film 60 may be a film containing unsaturated hydrocarbon and amorphous carbon, or it may be a lamination film of at least one of the SiN film, the SiCN film and the SiC film, and a film containing unsaturated hydrocarbon and amorphous carbon.

Figure 3A:
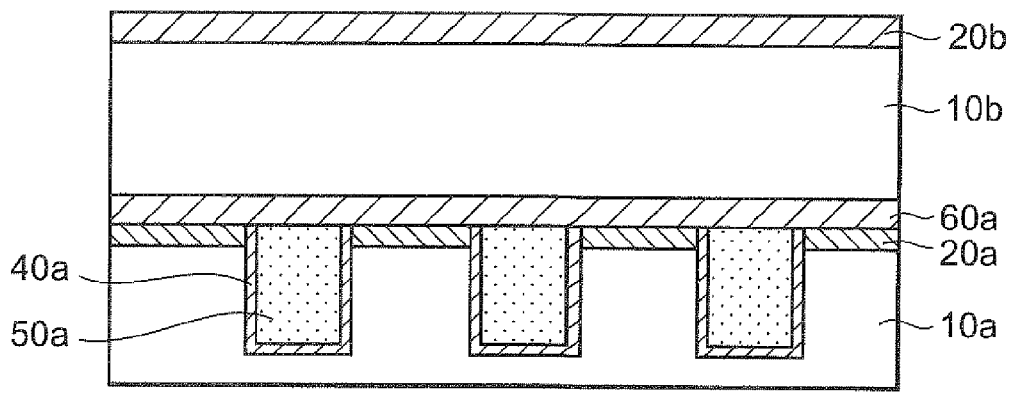
FIGS. 3A to 3C are cross sections illustrating manufacturing steps for the semiconductor device according to the embodiment of the present invention.
Figure 3B:
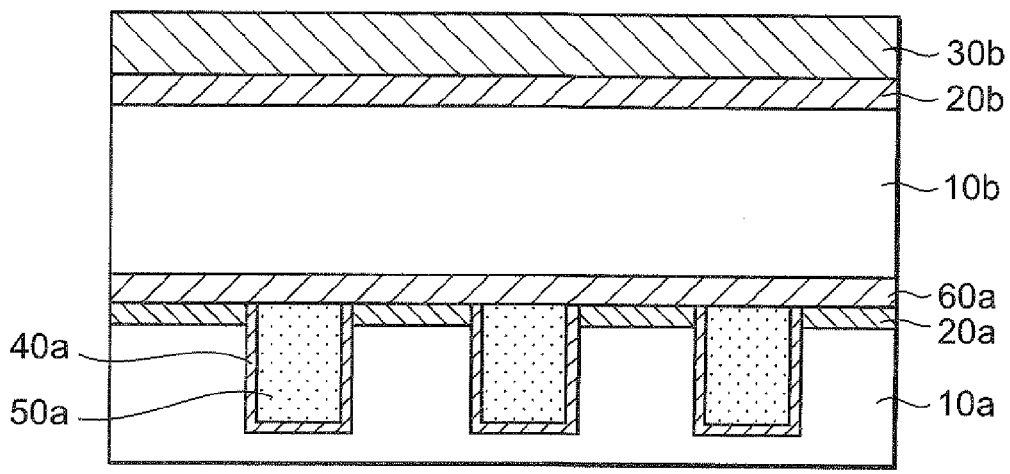

The hardmask 30 (30b) is formed on the surface modification layer 20, and it is removed along with removal of excess Cu wirings 50 outside the recess by the CMP process after the Cu wirings 50 is filled in the recess formed in the hard mask 30 and in the SiOCH film 10 (including surface modification layer 20) (see FIG. 3B). In addition, if the interlayer insulating film such as the SiOCH film 10 or the surface modification layer 20 is porous for obtaining a low dielectric constant, it strength is lowered. Therefore, if the hard mask 30 is provided, the SiOCH film 10 and, the surface modification layer 20 can be protected by the hard mask 30 in the CMP process.

As a material of the hard mask 30, there is one having a small C amount such as $SiO_2$.

The semiconductor substrate (not shown) is a substrate on which the semiconductor device 100 is constituted, and it is a monocrystalline silicon substrate, for example. In addition, the semiconductor substrate is not limited to that but may be a silicon on insulator (SOI) substrate, a thin film transistor (TFT), or a substrate for manufacturing liquid crystal.

A passivation film (not shown) is formed on the top surface of the semiconductor device 100. The passivation film has a role of protecting the semiconductor elements from external moisture or the like. As the passivation film, for example, a silicon oxide nitride film (SiON) formed by the plasma CVD method or a polyimide film is used.

With reference to FIGS. 2A to 2C and 5, the manufacturing method for the semiconductor device 100 according to the embodiment of the present invention is described.

The manufacturing method for the semiconductor device 100 according to the present invention includes:
forming the SiOCH film 10 (first insulating film) on the semiconductor substrate;
forming the surface modification layer 20 as the surface layer of the SiOCH film 10 by performing the plasma treatment using an inert gas;
forming the hard mask 30 on the surface modification layer 20;
forming the recess in the hard mask 30 and the SiOCH film 10, the recess passing through the hard mask 30 and the surface modification layer 20;
forming the Cu wiring 50 to fill in the recess;
exposing the surface modification layer 20 by removing the part of the Cu wiring 50 exposed outside the recess and by removing the hard mask 30; and
forming the cap insulating film 60 (second insulating film) on the surfaces of the exposed surface modification layer 20 and the Cu wiring 50.

Hereinafter, the individual steps are described in detail.

FIG. 2A illustrates a cross section of the lower layer wiring of the semiconductor device 100. The lower layer wiring has a structure in which a cap insulating film 60a is formed on the surface modification layer 20a that is formed as an insulating film on the SiOCH film 10a and on the Cu wirings 50a, and the Cu wirings 50a is filled in the wiring groove or the wiring hole having the barrier film 40a formed on the inner wall. This lower layer wiring can be also formed by the same process as that for the upper layer wiring that is described below.

First, the SiOCH film 10b is formed on the semiconductor substrate (FIG. 2B). Next, the He plasma treatment is performed using helium gas (FIG. 2C). Thus, the surface of the SiOCH film 10b is modified so as to form the surface modification layer 20b having a decreased carbon concentration and an increased oxygen concentration (FIG. 3A).

As the condition for the He plasma treatment, for example, the process temperature is set within a range from 200 to 400 degrees centigrade, the He gas flow rate is set within a range from 10 to 5,000 sccm, the pressure is set within a range from 1 to 20 Torr, the power of high frequency power supply for generating plasma is set within a range from 200 to 500 W, and the time period is set within a range from 5 to 60 seconds. Note that the inert gas means a noble gas such as helium, neon or argon.

Figure 3C:
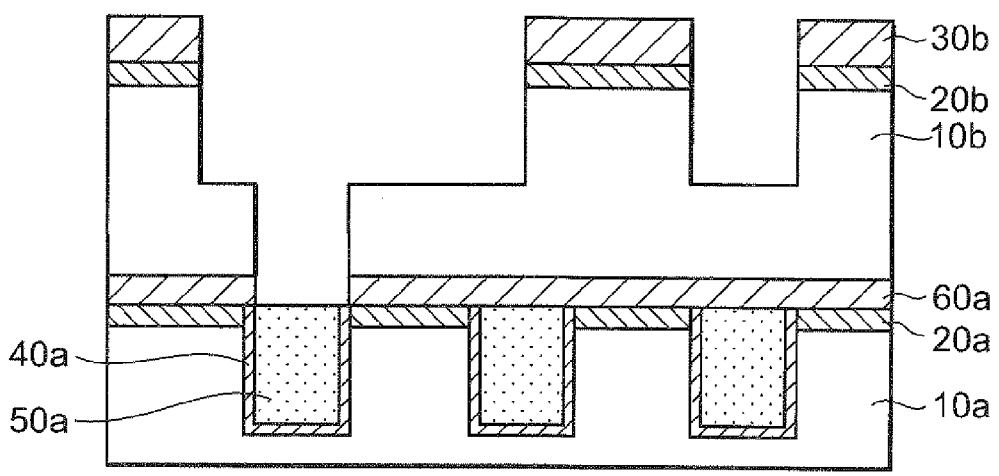
Figure 4A:
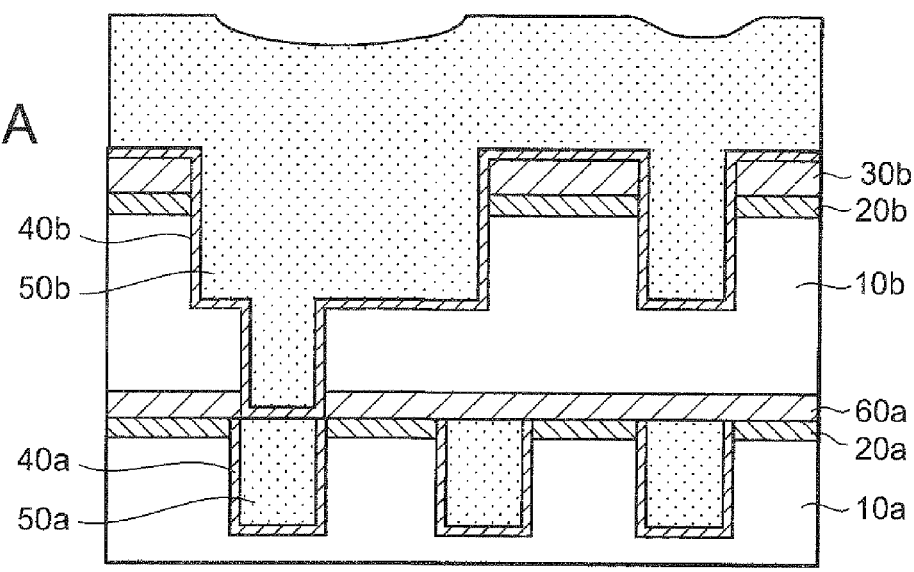
FIGS. 4A to 4C are cross sections illustrating manufacturing steps for the semiconductor device according to the embodiment of the present invention.

Next, the hard mask 30b made of $SiO_2$ or the like is formed on the surface modification layer 20b (FIG. 3B). Then, the recess (wiring groove or wiring hole) passing through the hard mask 30b and the surface modification layer 20b is formed in the hard mask 30b and the SiOCH film 10b by the lithography and the anisotropic etching (FIG. 3C). After that, the barrier film 40b is formed on the recess, and the Cu wirings 50b is filled in (FIG. 4A).

Figure 4B:
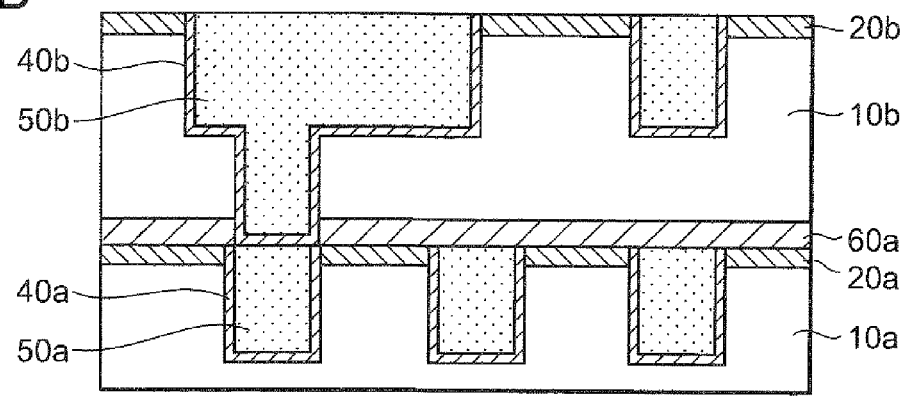

Next, heat treatment is performed for grain growth of Cu. The temperature for this heat treatment is set within a range from 200 to 400 degrees centigrade, for example, and the time period is set within a range from 30 seconds to one hour. Then, the Cu wirings 50b exposed outside the recess, the barrier film 40b, and the hard mask 30b are removed by the polishing technique such as the CMP process using alkaline slurry as the polishing liquid, whereby the surface modification layer 20b is exposed. Then, the CMP process is stopped in the state which a part of the surface modification layer 20b is left (FIG. 4B).

Figure 4C:
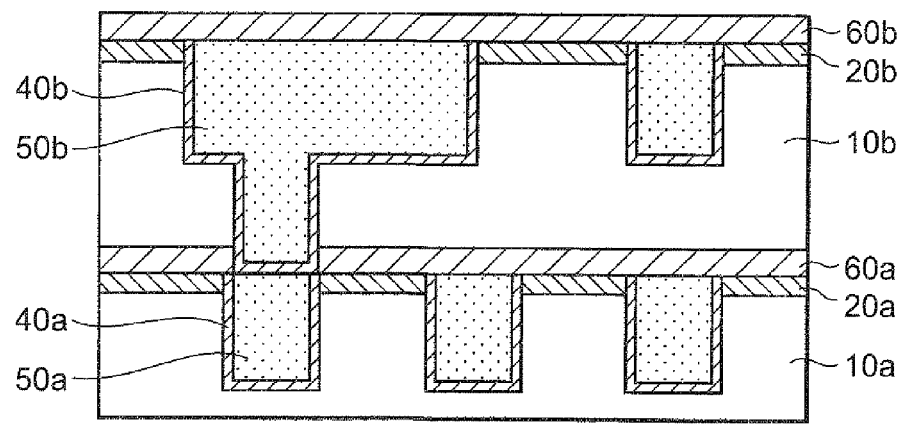

Next, the cap insulating film 60b is formed on the surfaces of the exposed surface modification layer 20b and the Cu wirings 50b by the plasma CVD method (FIG. 4C). Thus, the upper surfaces of the Cu wirings 50b and the surface modification layer 20b are covered with the cap insulating film 60b. In other words, the surfaces of the Cu wirings 50b and the surface modification layer 20b contact with the cap insulating film 60b.

The steps illustrated in FIGS. 2B to 4C are repeated so that the upper layer wirings are formed on the lower layer wiring. In addition, although this embodiment describes a dual damascene method in which the wiring groove and the wiring hole are formed simultaneously, it is possible to adopt a single damascene method for forming the wirings.

Figure 5:
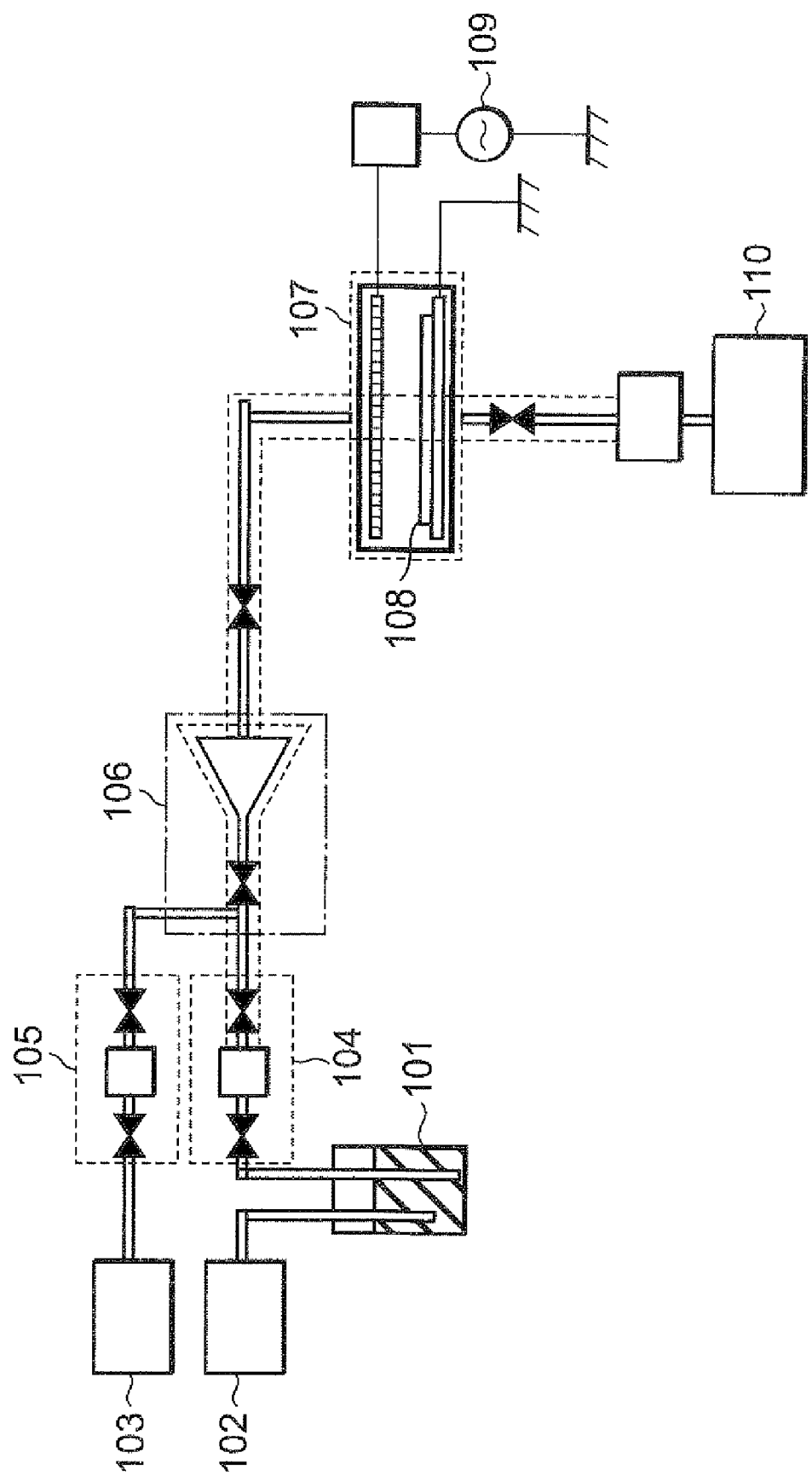
FIG. 5 is a schematic diagram illustrating an apparatus that is used for forming an SiOCH film.

Hereinafter, the manufacturing steps for the SiOCH film 10 are described further in detail. FIG. 5 is a schematic diagram illustrating an apparatus that is used for forming the SiOCH film.

As illustrated in FIG. 5, a reservoir 101 is a container for supplying raw material monomer to be a first insulating film. A raw material pressure feeding portion 102 applies a pressure to the raw material in the reservoir 101 so as to feed out the same, and He gas is used for pressing. A carrier gas supplying portion 103 supplies He gas for transporting the raw material monomer. A liquid mass flow controller 104 is an apparatus for controlling a flow rate of the raw material monomer to be supplied A gas mass flow controller 105 is an apparatus for controlling a flow rate of the He gas as the carrier gas. A vaporizer 106 is an apparatus for vaporizing the raw material monomer. A reactor 107 is a container for forming a film of the vaporized raw material monomer using a chemical vapor deposition process.

A high frequency (RF) power supply 109 for generating plasma is an apparatus for supplying electric power for generating plasma of the vaporized raw material monomer and the carrier gas. A substrate 108 is a target for forming films by the chemical vapor deposition process. A vacuum pump 110 is an apparatus for evacuating the raw material, gas and the carrier gas that has been led in the reactor 107.

Next, the manufacturing steps for the SiOCH film 10 using the apparatus illustrated in FIG. 5 are described.

As the raw material monomer to make the first insulating film (SiOCH film), a raw material having the cyclic organic silica structure defined in the following Formula (3) is used. The raw material monomer is fed out from the reservoir 101 by the He gas from the raw material pressure feeding portion 102, and the liquid mass flow controller 104 controls the flow rate thereof. On the other hand, the carrier gas supplying portion 103 supplies the He gas and the flow rate thereof is controlled by the gas mass flow controller 105.

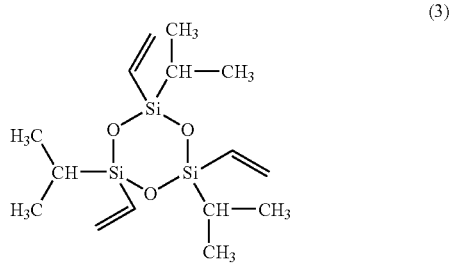

(3)

The raw material monomer and the He gas as the carrier gas are mixed with each other just before the vaporizer 106 and the mixture is led in the vaporizer 106. A heater block (not shown) is disposed and is heated inside the vaporizer 106, in which the liquid raw material monomer is vaporized, and then the raw material monomer is led into the reactor 107. In the reactor 107, the high frequency power of 13.56 MHz generates plasma of the vaporized raw material monomer and the carrier gas, and the SiOCH film is formed on the substrate 108 by the chemical vapor deposition process.

The rate of feeding the raw material monomer is preferably within a range from 0.1 g/min to 10 g/min, and is more preferably 2 g/min or lower. The flow rate of He gas as the carrier gas is preferably within a range from 50 sccm to 5,000 sccm, and is more preferably 2,000 sccm or lower. The pressure inside the reactor 107 is preferably within a range from 133 to 1,333 Pa. The output of the RF power supply 109 is preferably 2,000 W or lower, and is more preferably 1,000 W or lower.

The effect of this embodiment is described.

The semiconductor device 100 includes the surface modification layer 20 that is formed by modifying the surface layer of the SiOCH film 10 and has a lower carbon concentration and a higher oxygen concentration than the SiOCH film 10 has, and the cap insulating film 60 that contacts with the surface of the Cu wirings 50 and the surface of the surface modification layer 20.

This surface modification layer 20 is formed by modifying the surface layer of the SiOCH film 10, and hence it is thinner than the case of depositing the film. Therefore, even if the dielectric constant of the surface modification layer 20 is higher than the dielectric constant of the SiOCH film 10, it is possible to suppress an increase in the dielectric constant of the entire SiOCH film 10 because the surface modification layer 20 is sufficiently thin.

Moreover, the surface modification layer 20 has a lower carbon concentration and a higher oxygen concentration than the SiOCH film 10 has, and hence it has an affinity for water.

Therefore, when the surface modification layer 20 is exposed in the CMP process, sweat hardly remains so that residual particles and generation of a watermark after the CMP process can be reduced.

According to the semiconductor device 100 of this embodiment and the manufacturing method for the same, the SiOCH film 10 as the interlayer insulating film using the low dielectric constant film can be protected from damage in the CMP process while an effective dielectric constant of the SiOCH film 10 as the insulating film between wires can be reduced.

Moreover, there is a problem that the dielectric constant of the SiOCH film 10 increases when the porous structure of the SiOCH film 10 absorbs water. However, the semiconductor device 100 of this embodiment can suppress the increase of the dielectric constant because the diameter of the pores in the porous structure of the SiOCH film 10 is small, and hence water is hardly absorbed.

The semiconductor device and the manufacturing method for the same according to the present invention are not limited to those described in the above embodiment, which can be modified variously.

Example

Next, an example of the present invention is described. In the following example, the single damascene method was used for forming the first wiring layer. The first wiring layer was produced similarly to the upper layer wiring and the lower layer wiring of the semiconductor device 100 described above in the first embodiment.

Note that the present invention is not limited to the following example, and it should be interpreted that modifications and improvements thereof within the scope for achieving the objects of the present invention are included in the scope of the present invention. A second and subsequent wiring layers that are to be formed by the dual damascene method or the single damascene method can be formed in the same manner as the first wiring layer.

Example 1

First, the SiO$_2$ film having a thickness of 300 nm was formed on the silicon substrate, and the first wiring layer was formed on the same by the single damascene method.

Next, the porous SiOCH film was formed on the SiO$_2$ film by the plasma CVD method using the raw material having the cyclic organic silica structure expressed in the following Formula (3) in the same manner as described above in the first embodiment. The porous SiOCH film is the insulating film between wires, and its thickness was 120 nm while the relative dielectric constant was 2.5.

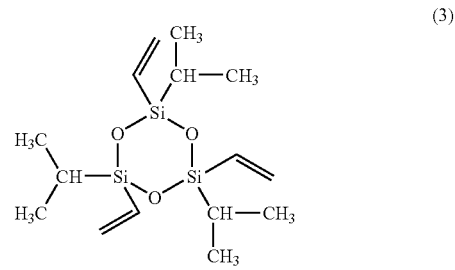

(3)

After that, the He plasma treatment was performed at the RF power of 440 W for 15 seconds of the process time, and hence the surface modification layer was formed on the surface of the porous SiOCH film.

Further on the surface modification layer, the SiO₂ film having a thickness of 80 nm was formed as the hard mask by the plasma CVD method using SiH₄ gas as a source gas in the same chamber as the He plasma treatment chamber. Here, the hard mask may be the SiO₂ film formed by using tetraethoxysilane (TEOS) as the source gas. In addition, the formation of the surface modification layer by the He plasma treatment and the formation of the SiO₂ hard mask may be performed in different chambers.

Next, the wiring grooves were formed in the lamination insulating film including the SiOCH film, the surface modification layer, and the hard mask by the lithography and the dry etching. After that, the TaN film or the Ta film as the barrier film and the Cu thin film having a thickness of 40 nm were formed on the entire surface of the silicon substrate surface by an ionization sputtering method, and further the Cu wirings were embedded as electrodes by an electrolytic plating method.

Next, the heat treatment was performed for grain growth of Cu in nitrogen atmosphere at 350 degrees centigrade for two minutes, and afterward the excess Cu wirings were removed by the CMP process. In other words, the slurry and a polishing head were changed, and the excess Cu wirings, the Ta film, the TaN film, and the hard mask were completely removed by the CMP process so that the surface modification layer of the porous SiOCH film is exposed. The CMP process was finished in the state where the surface modification layer was left in part.

After that, the SiCN film having a thickness of 30 nm was formed as the cap insulating film on the entire surface of the Cu wirings and the surface modification layer. Thus, the device was obtained having a structure in which the cap insulating film was formed so as to contact with the surface of the Cu wirings and the surface of the surface modification layer formed on the surface layer of the porous SiOCH film.

Experiment 1

Figure 6A:
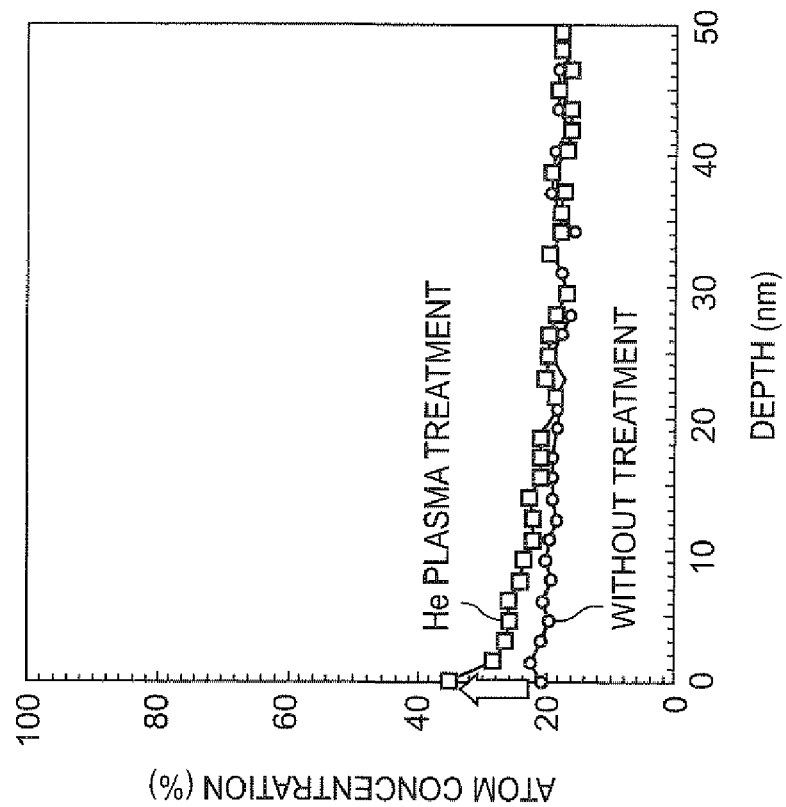
FIGS. 6A and 6B are graphs illustrating a relationship between depth of the SiOCH film and a carbon concentration as well, as a relationship between depth of the SiOCH film and an oxygen concentration.
Figure 6B:
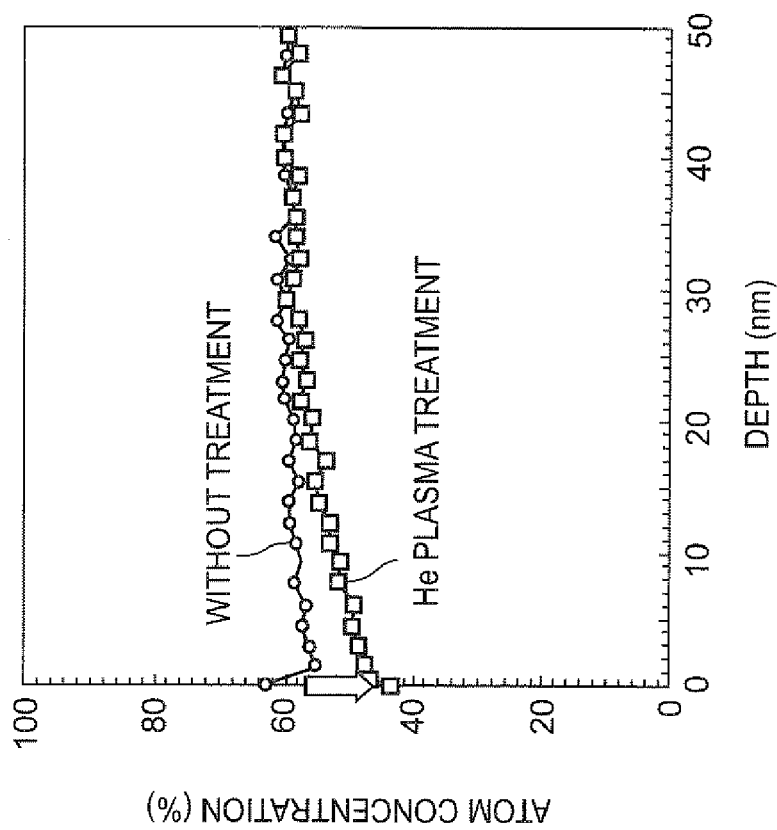

FIGS. 6A and 6B are graphs illustrating a relationship between depth of the porous SiOCH film and the carbon concentration as well as a relationship between depth of the porous SiOCH film and the oxygen concentration, in the case where the He plasma treatment was performed on the porous SiOCH film produced in Example 1 (indicated by "He PLASMA TREATMENT"), and in the case where the He plasma treatment was not performed on the porous SiOCH film produced in Example 1 (indicated by "WITHOUT TREATMENT"). The carbon concentration and the oxygen concentration in the porous SiOCH film were determined by the X-ray photoelectron spectral (XPS) analysis. It is understood from the graphs that the carbon concentration at the surface of the porous SiOCH film is decreased from GO atomic percent to 43 atomic percent by the He plasma treatment, and that the oxygen concentration is changed from 20 atomic percent to 35 atomic percent.

Experiment 2

Figure 7C:
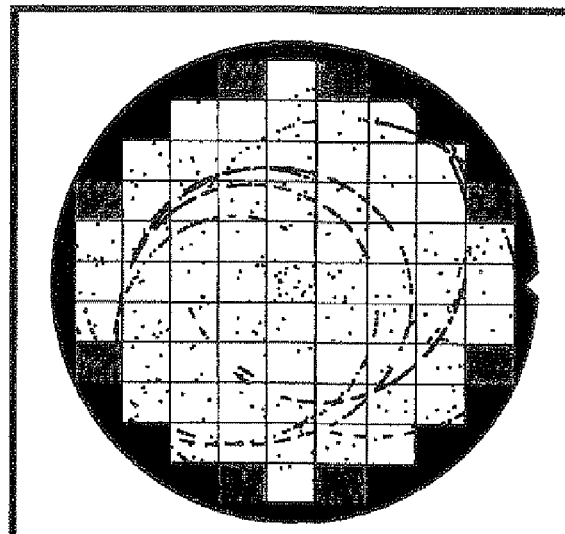
FIGS. 7A to 7C are diagrams illustrating defect distributions in a wafer surface after a CMP process is completed.
Figure 7B:
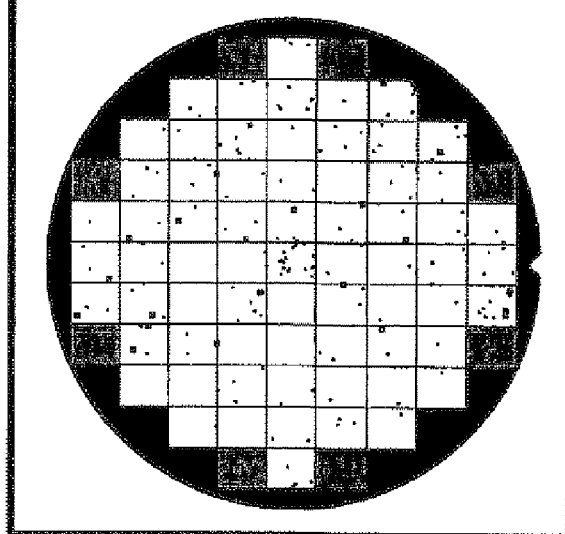
Figure 7A:
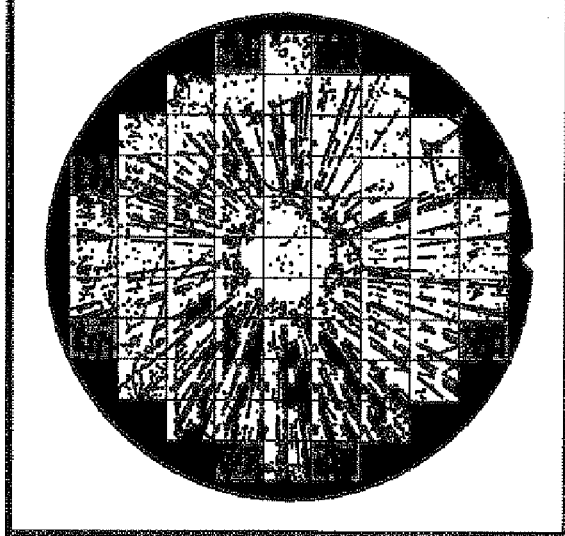

FIGS. 7A to 7C are diagrams illustrating defect distributions in a wafer surface after the CMP process is completed. FIGS. 7A to 7C respectively illustrate the cases where the He plasma treatment was not performed at all, was performed for 15 seconds, and was performed for 50 seconds on the porous SiOCH film described above in Example 1.

As illustrated in FIG. 7A, in case of not performing the He plasma treatment at all, a defect distributing radially on the wafer surface was recognized. As a result of observation of this defect area, it was found to be a defect due to the watermark. On the other hand, as illustrated in FIG. 7B, in case of performing the He plasma treatment for 15 seconds, it was in a low defect state. However, as illustrated in FIG. 7C, in case of extending the time period of the He plasma treatment to 50 seconds, a large scale of scratch was generated.

As a cause of this result, it can be considered that the surface modification layer was not formed on the surface of the porous SiOCH film in case of not performing the He plasma treatment at all, and the hydrophobic state remained, and hence the watermark increased after the CMP process. On the other hand, it is considered that the surface became hydrophilic with Si—OH when the He plasma treatment was performed, and hence the watermark was suppressed. However, it is considered that the surface modification layer was hardened and easily exfoliated in the CMP process in case of performing the He plasma treatment excessively, and hence a large scale of scratch was induced.

Experiment 3

Figure 8:
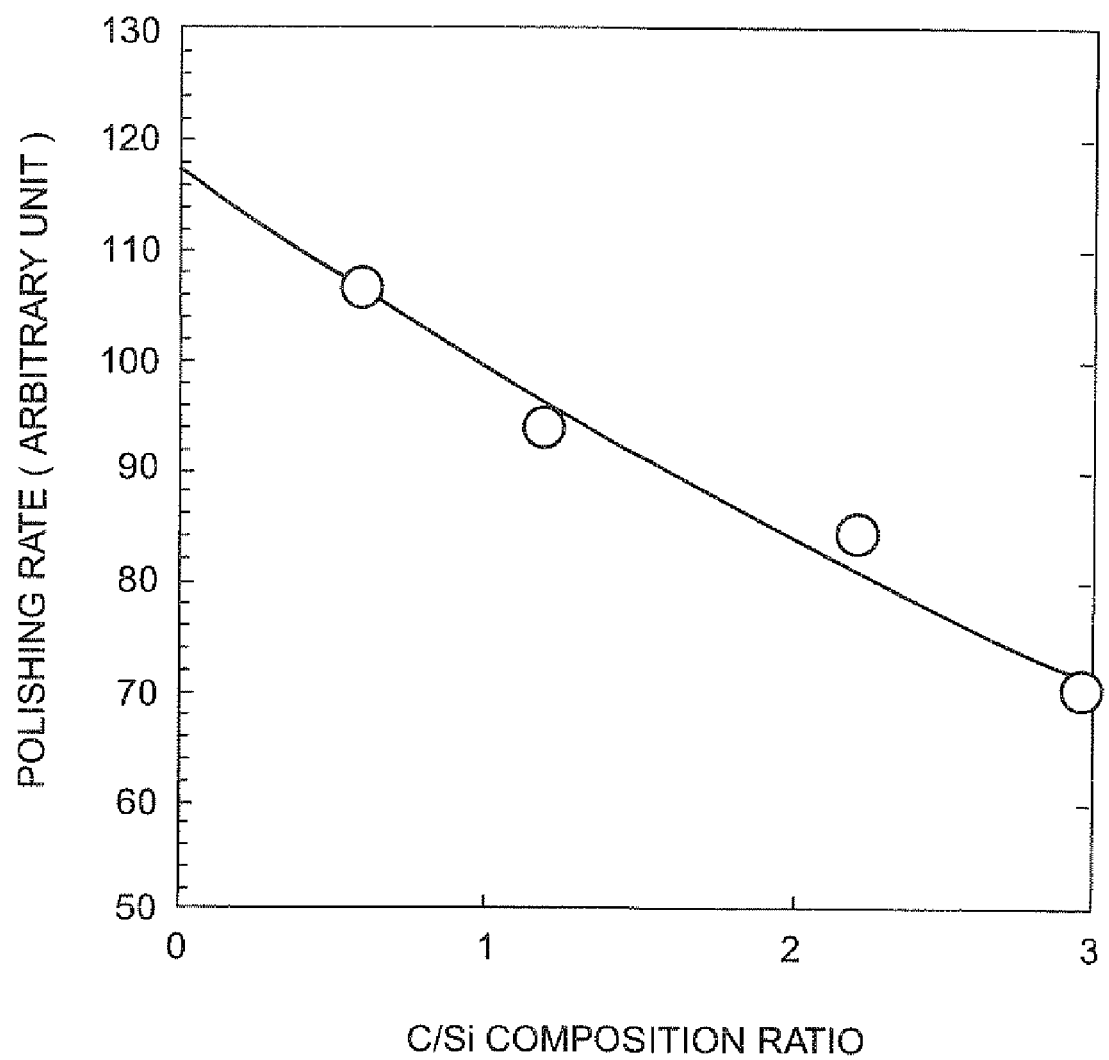
FIG. 8 is a graph illustrating a relationship between a C/Si composition ratio of the SiOCH film and a polishing rate.
Figure 10A:
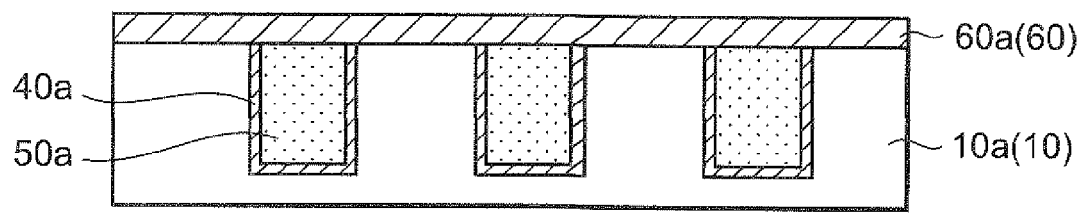
FIGS. 10A to 10C are cross sections illustrating conventional manufacturing steps for Cu wirings.
Figure 10B:
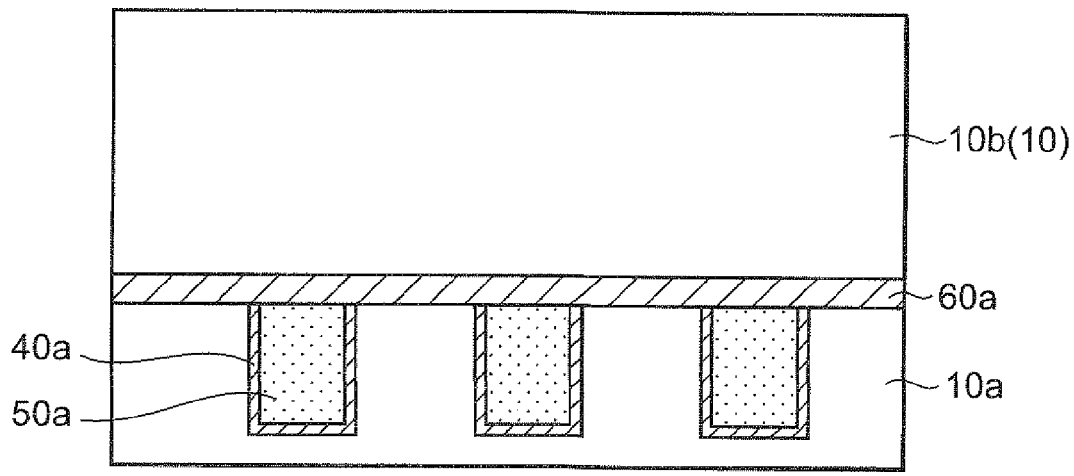
Figure 10C:
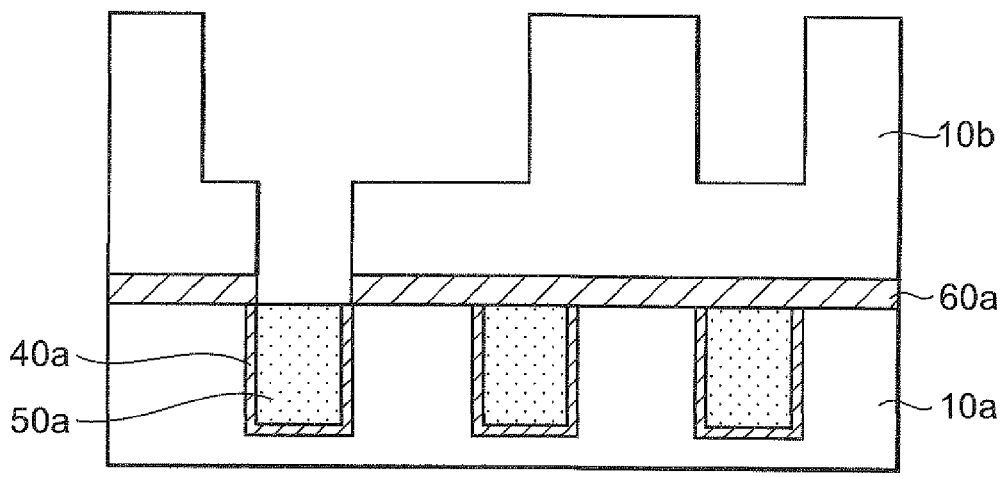
Figure 11A:
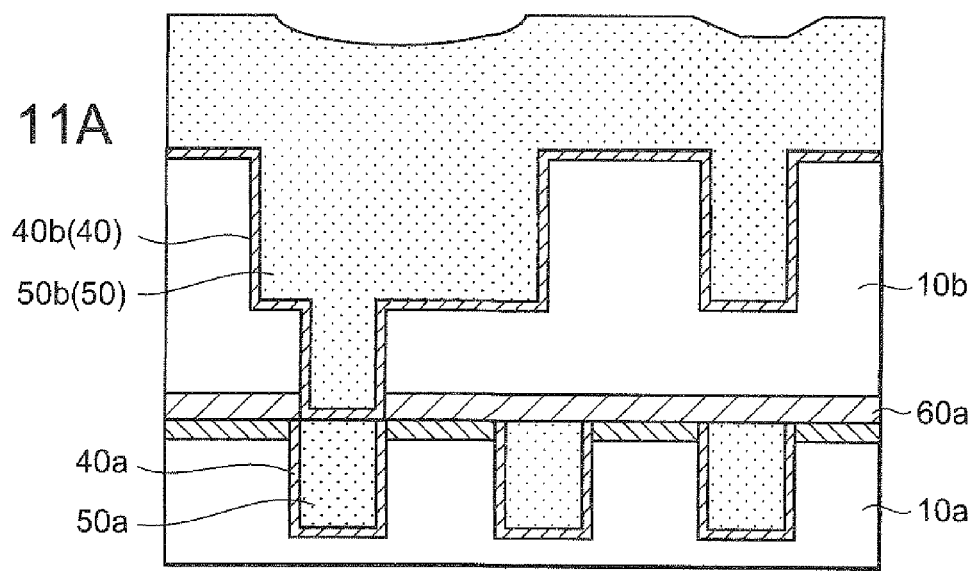
FIGS. 11A to 11C are cross sections illustrating the conventional manufacturing steps for Cu wirings.
Figure 11B:
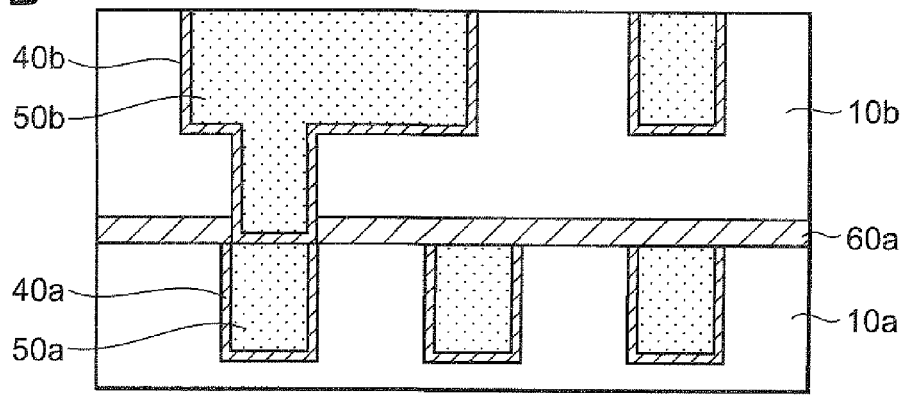
Figure 11C:
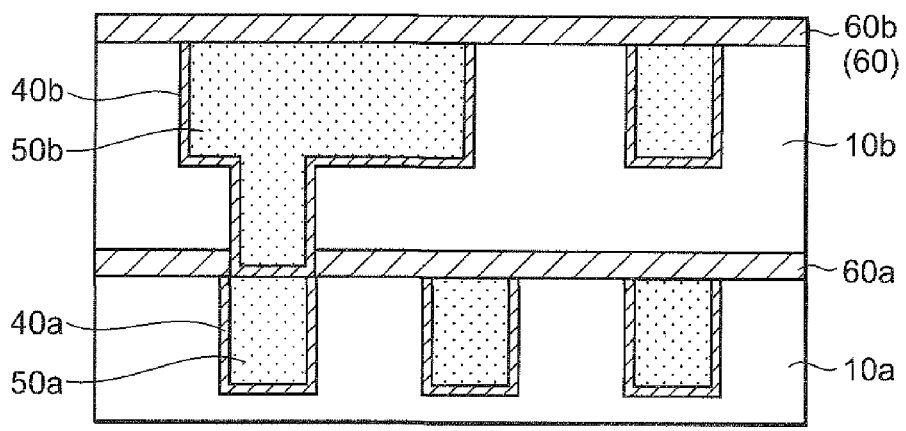

FIG. 8 is a graph illustrating a relationship between a C/Si composition ratio of the SiOCH film and the polishing rate.

It was understood from FIG. 8 that the CMP polishing rate was decreased along with an increase in the C/Si composition ratio of the SiOCH film.

Experiment 4

FIG. 9 is a graph illustrating a relationship between the SiOCH film and a polishing amount. In addition, there are three types of SiOCH films in the horizontal axis, which have different relative dielectric constants and C/Si composition ratios. The vertical axis represents the polishing amount for each wiring pattern (L/S, where L denotes wiring width and S denotes wiring space) or wiring width (L) of each SiOCH film.

The polishing amount of the SiOCH film was determined by performing the He plasma treatment on the SiOCH film for 15 seconds and overpolishing for 30 seconds from the state where the SiO₂ hard mask is sufficiently removed, and then using a scanning electron microscope (SEM) to observe the decreased amount of the film.

As illustrated in FIG. 9, it is understood that polishing of the porous SiOCH film and the rigid SiOCH film is stopped in the film having a large carbon amount, not depending on the relative dielectric constant. Therefore, the porous SiOCH film having a large carbon amount is used, and hence variation of the film thickness is controlled to be small with respect to overpolishing. Therefore, the surface modification layer can be securely left. Thus, it is possible to reduce generation of a watermark or particles.

What is claimed is:

1. A semiconductor device comprising:
   a semiconductor substrate;
   a first insulating film including a first SiOCH film formed on the semiconductor substrate;
   a surface modification layer including a second SiOCH film formed by modifying a surface layer of the first insulating film, the second SiOCH film having a lower atomic carbon concentration and a higher atomic oxygen concentration than the first insulating film;
   a metal wiring filled in a recess formed in the surface modification layer and the first insulating film; and a second insulating film contacting surfaces of the metal wiring and the surface modification layer.

2. The semiconductor device according to claim 1, wherein the surface modification layer has a thickness equal to or larger than 3 nm and smaller than 30 nm.

3. The semiconductor device according to claim 1, wherein the first SiOCH film of the first insulating film has an atomic composition ratio expressed by C/Si that is within a range from 1 to 10.

4. The semiconductor device according to claim 1, wherein the carbon concentration in the surface modification layer is equal to or larger than 50% and smaller than 90% of the atomic carbon concentration in the first insulating film, and the atomic oxygen concentration in the surface modification layer is equal to or larger than 110% and smaller than 200% of the oxygen concentration in the first insulating film.

5. The semiconductor device according to claim 1, wherein the first insulating film has a plurality of pores, an average diameter of each of the plurality of pores is smaller than 0.8 nm, and the plurality of pores are separated from each other.

6. The semiconductor device according to claim 1, wherein the second insulating film is one of a single-layer film using any one of an SiN film, an SiCN film, and an SiC film and a lamination film using at least two of an SiN film, an SiCN film, and an SiC film.

7. The semiconductor device according to claim 1, wherein the second insulating film is one of a first film containing unsaturated hydrocarbon and amorphous carbon, and a lamination film including the first film and a second film using at least one of an SiN film, an SiCN film, and an SiC film.

8. The semiconductor device according to claim 1, wherein the first insulating film is formed using, as a material, a compound having a cyclic organic silica structure expressed by the following Formula (1):

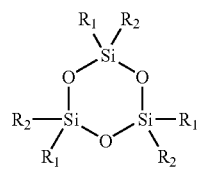

(1)

where each of R1 and R2 is any one of vinyl radical, allyl radical, methyl radical, ethyl radical, propyl radical, isopropyl radical, and butyl radical.

9. The semiconductor device according to claim 8, wherein the compound having the cyclic organic silica structure is expressed by the following formula (2);

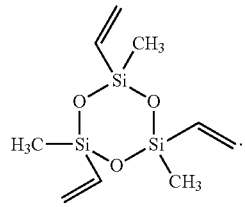

(2)

10. The semiconductor device according to claim 8, wherein the compound having the cyclic organic silica structure is expressed by the following Formula (3):

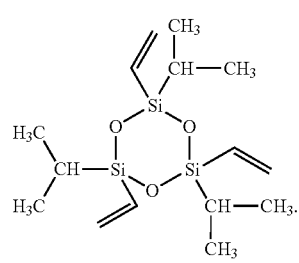

(3)

11. The semiconductor device according to claim 1, wherein the metal wiring is a wiring containing copper.

12. A semiconductor device comprising:
a semiconductor substrate;
a first insulating film including a first SiOCH film formed on the semiconductor substrate;
a surface modification layer including a second SiOCH film, the second SiOCH film having a lower atomic carbon concentration and a higher atomic oxygen concentration than the first SiOCH film;
a metal wiring filled in a recess formed in the surface modification layer and the first insulating film; and
a second insulating film contacting surfaces of the metal wiring and the surface modification layer.

13. The semiconductor device according to claim 12, wherein the surface modification layer has a concentration profile in which the carbon concentration decreases from the first insulating film toward the second insulating film while the oxygen concentration increases from the first insulating film toward the second insulating film.

14. A semiconductor device according to claim 12, wherein the second insulating film is one of a single-layer film using any one of an SiN film, an SiCN film, and an SiC film and a lamination film using at least two of an SiN film, an SiCN film, and an SiC film.

* * * * *